United States Patent
Wu et al.

(10) Patent No.: US 10,356,901 B2
(45) Date of Patent: Jul. 16, 2019

(54) MANUFACTURING METHOD OF CIRCUIT BOARD STRUCTURE

(71) Applicant: Unimicron Technology Corp., Taoyuan (TW)

(72) Inventors: Ming-Hao Wu, Taoyuan (TW); Wen-Fang Liu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/008,060

(22) Filed: Jun. 14, 2018

(65) Prior Publication Data
US 2018/0295723 A1 Oct. 11, 2018

Related U.S. Application Data

(62) Division of application No. 15/427,061, filed on Feb. 8, 2017, now Pat. No. 10,039,184.

(30) Foreign Application Priority Data

Nov. 30, 2016 (TW) .............................. 105139419 A

(51) Int. Cl.
*H05K 1/11* (2006.01)
*H05K 3/00* (2006.01)
(Continued)

(52) U.S. Cl.
CPC .............. *H05K 1/111* (2013.01); *H05K 1/115* (2013.01); *H05K 3/0044* (2013.01);
(Continued)

(58) Field of Classification Search
CPC .. H05K 1/00; H05K 1/02; H05K 1/03; H05K 1/09; H05K 1/11; H05K 1/14; H05K 1/18; H05K 3/00; H05K 3/02; H05K 3/03; H05K 3/06; H05K 3/10; H05K 3/16; H05K 3/22; H05K 3/28; H05K 3/30; H05K 3/36;
(Continued)

(56) References Cited

U.S. PATENT DOCUMENTS 6,242,995 B1 * 6/2001 Shikama ............... H01F 17/045
336/172
7,768,119 B2 * 8/2010 Chia .................. H01L 23/49816
257/660
(Continued)

*Primary Examiner* — Xiaoliang Chen
(74) *Attorney, Agent, or Firm* — JCIPRNET

(57) ABSTRACT

A manufacturing method of a circuit board structure includes the following steps: providing an inner circuit structure which includes a core layer; performing a build-up process to laminate a first build-up circuit structure on a first patterned circuit layer of the inner circuit structure, wherein the first build-up circuit structure includes an inner dielectric layer, and the inner dielectric layer directly covers an upper surface of the core layer and the first patterned circuit layer; removing a portion of the first build-up circuit structure to form an opening extending from a first surface of the first build-up circuit structure relatively far away from the inner circuit structure to a portion of the inner dielectric layer; performing a sandblasting process on a first inner surface of the inner dielectric layer exposed by the opening to at least remove the portion of the inner dielectric layer exposed by the opening.

8 Claims, 8 Drawing Sheets

(51) Int. Cl.
  *H01L 21/32* (2006.01)
  *H01L 23/48* (2006.01)
  *H05K 3/46* (2006.01)
  *H05K 3/34* (2006.01)
(52) U.S. Cl.
  CPC ......... *H05K 3/4697* (2013.01); *H05K 3/3452* (2013.01); *H05K 2201/0376* (2013.01); *H05K 2203/025* (2013.01); *H05K 2203/0228* (2013.01)
(58) Field of Classification Search
  CPC ... H05K 3/40; H05K 3/42; H05K 3/46; H01L 21/32; H01L 21/58; H01L 23/00; H01L 23/14; H01L 23/48
  USPC ....... 174/250, 251, 254, 255, 257–264, 266; 361/746, 749, 753, 762–764, 767, 792; 257/700, 702
  See application file for complete search history.

(56) References Cited

U.S. PATENT DOCUMENTS

| | | | | |
|---|---|---|---|---|
| 9,723,728 B2* | 8/2017 | Shimizu | H05K 3/4697 |
| 9,723,729 B2* | 8/2017 | Furusawa | H01L 23/13 |
| 9,832,878 B2* | 11/2017 | Shimizu | H05K 1/185 |
| 9,860,984 B2* | 1/2018 | Wu | H05K 1/115 |
| 10,004,143 B2* | 6/2018 | Ishihara | H05K 3/4682 |
| 2004/0099716 A1* | 5/2004 | Yuan | H01L 24/10 228/246 |
| 2005/0029651 A1* | 2/2005 | Tomioka | H01L 23/3121 257/712 |
| 2005/0140434 A1* | 6/2005 | Abe | H03F 3/195 330/66 |
| 2006/0003495 A1* | 1/2006 | Sunohara | H01L 21/4857 438/124 |
| 2006/0169484 A1* | 8/2006 | Yamashita | H01L 23/49816 174/250 |
| 2006/0237225 A1* | 10/2006 | Kariya | H01L 23/49827 174/260 |
| 2007/0025092 A1* | 2/2007 | Lee | H01L 23/49822 361/761 |
| 2008/0102410 A1* | 5/2008 | Kim | H01L 21/4857 430/312 |
| 2008/0128865 A1* | 6/2008 | Chia | H01L 23/49816 257/620 |
| 2008/0142951 A1* | 6/2008 | Hsu | H01L 23/5389 257/700 |
| 2009/0026604 A1* | 1/2009 | Shin | H01L 21/4857 257/702 |
| 2009/0175017 A1* | 7/2009 | Kita | H01L 21/481 361/792 |
| 2009/0294027 A1* | 12/2009 | Wang | H01L 21/4857 156/150 |
| 2010/0096171 A1* | 4/2010 | Lee | H05K 3/3484 174/257 |
| 2010/0147560 A1* | 6/2010 | Kaneko | H01L 23/13 174/250 |
| 2010/0170700 A1* | 7/2010 | Nakamura | H05K 1/183 174/254 |
| 2012/0012371 A1* | 1/2012 | Kita | H01L 21/4857 174/255 |
| 2012/0073131 A1* | 3/2012 | Miyazawa | H01L 21/4853 29/846 |
| 2012/0081864 A1* | 4/2012 | Sakurai | H01L 23/49822 361/753 |
| 2012/0181074 A1* | 7/2012 | Ishihara | H05K 3/4691 174/261 |
| 2012/0211271 A1* | 8/2012 | Hando | H01L 21/6835 174/261 |
| 2013/0014982 A1* | 1/2013 | Segawa | H05K 1/141 174/263 |
| 2013/0020120 A1* | 1/2013 | Ishihara | H05K 1/183 174/262 |
| 2013/0082386 A1* | 4/2013 | Meyer-Berg | H01L 23/12 257/762 |
| 2013/0299223 A1* | 11/2013 | Yoo | H05K 3/4697 174/259 |
| 2013/0305530 A1* | 11/2013 | Ishihara | H05K 3/4691 29/847 |
| 2013/0341077 A1* | 12/2013 | Ouchi | H05K 3/225 174/264 |
| 2014/0077357 A1* | 3/2014 | Kung | H01L 23/48 257/737 |
| 2014/0196939 A1* | 7/2014 | Nishida | H05K 3/28 174/261 |
| 2015/0022985 A1* | 1/2015 | Na | H05K 1/183 361/763 |
| 2015/0083476 A1* | 3/2015 | Kim | H05K 1/113 174/260 |
| 2015/0092356 A1* | 4/2015 | Yoshikawa | H01L 25/00 361/746 |
| 2015/0138741 A1* | 5/2015 | Moon | H05K 1/185 361/762 |
| 2015/0156880 A1* | 6/2015 | Daizo | H05K 1/183 174/251 |
| 2015/0250054 A1* | 9/2015 | Yoshikawa | H05K 3/4007 361/767 |
| 2016/0037646 A1* | 2/2016 | Lee | H05K 1/186 361/764 |
| 2016/0037647 A1* | 2/2016 | Shimizu | H05K 3/4697 361/764 |
| 2016/0044789 A1* | 2/2016 | Shimizu | H05K 1/185 174/251 |
| 2016/0066429 A1* | 3/2016 | Taniguchi | H05K 1/0278 361/749 |
| 2016/0081191 A1* | 3/2016 | Mok | H05K 3/4697 174/257 |
| 2016/0095207 A1* | 3/2016 | Taniguchi | H05K 3/4691 174/252 |
| 2016/0113110 A1* | 4/2016 | Furusawa | H05K 1/0271 174/251 |
| 2016/0120033 A1* | 4/2016 | Furusawa | H01L 23/13 174/251 |
| 2016/0183363 A1* | 6/2016 | Lee | H05K 3/4691 174/254 |
| 2016/0242277 A1* | 8/2016 | Lee | H05K 3/4007 |
| 2016/0316565 A1* | 10/2016 | Chen | H05K 1/185 |
| 2016/0374196 A1* | 12/2016 | Lee | H05K 3/4697 |
| 2016/0374197 A1* | 12/2016 | Lee | H05K 1/0298 |
| 2016/0381796 A1* | 12/2016 | Lee | H05K 1/115 174/262 |
| 2017/0019989 A1* | 1/2017 | Lee | H05K 1/144 |
| 2017/0053878 A1* | 2/2017 | Kajihara | H01L 23/49822 |
| 2017/0064825 A1* | 3/2017 | Ishihara | H05K 1/113 |
| 2017/0064835 A1* | 3/2017 | Ishihara | H05K 3/4682 |
| 2017/0171973 A1* | 6/2017 | Wu | H05K 1/115 |
| 2017/0207196 A1* | 7/2017 | Lee | H01L 23/48 |

\* cited by examiner

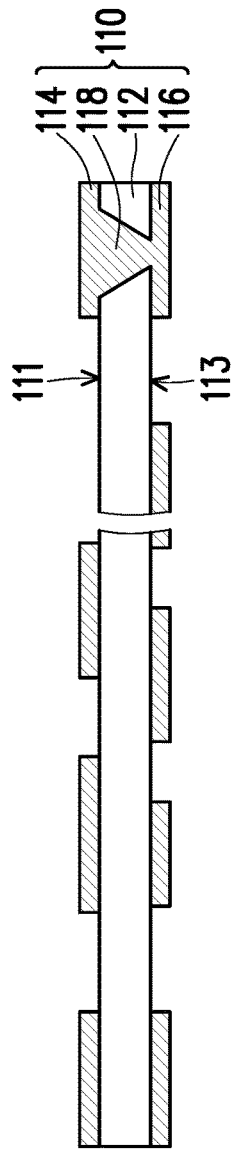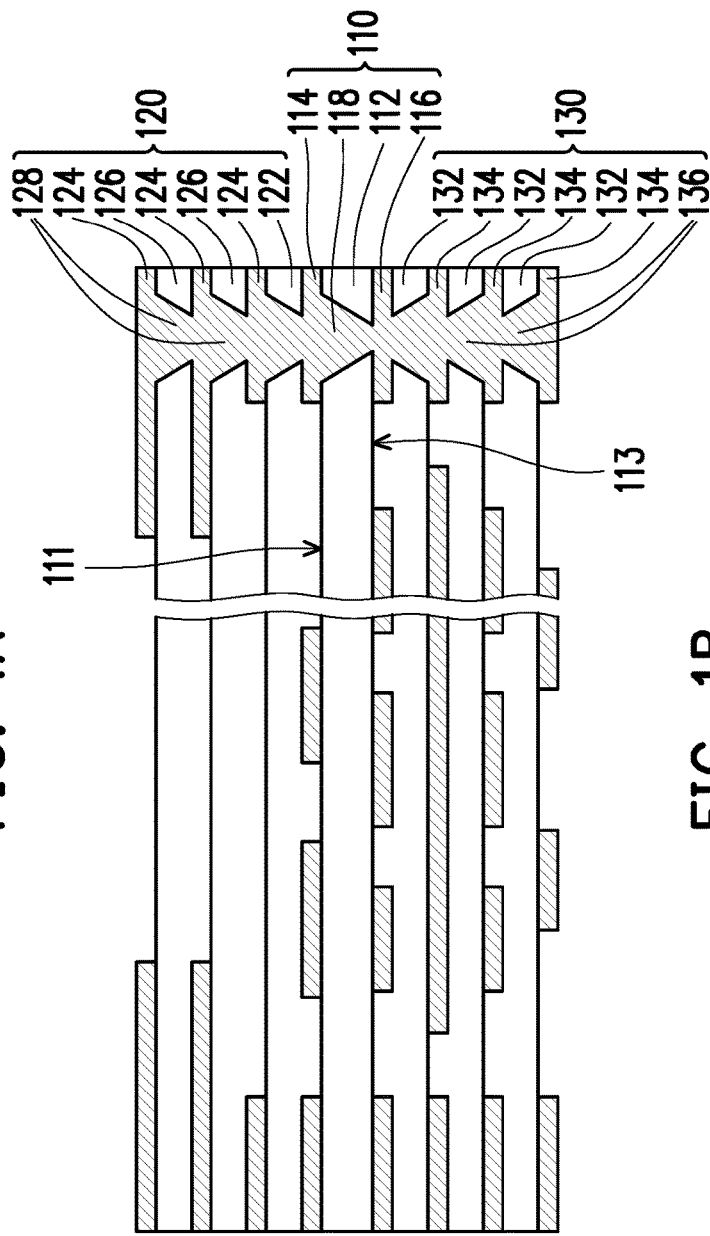
FIG. 1A
FIG. 1B

MANUFACTURING METHOD OF CIRCUIT BOARD STRUCTURE

CROSS-REFERENCE TO RELATED APPLICATION

This application is a divisional application of and claims the priority benefit of U.S. application Ser. No. 15/427,061, filed on Feb. 8, 2017, now allowed, which claims the priority benefit of Taiwan application serial no. 105139419, filed on Nov. 30, 2016. The entirety of each of the above-mentioned patent applications is hereby incorporated by reference herein and made a part of this specification.

BACKGROUND OF THE INVENTION

Technical Field

The invention relates to a circuit board structure and a manufacturing method thereof, more particularly, relates a circuit board structure having a cavity and a manufacturing method thereof.

Background

Generally, in order to manufacture a circuit board structure having a cavity, a copper alignment layer usually needs being formed on the core layer of the inner circuit structure for the following purpose. When laser ablates the circuit structure to form the cavity in the subsequent process, other than being considered as a laser blocking layer to prevent the circuit structure from being excessively ablated, the copper alignment layer may also be considered as a laser alignment pattern that is helpful in performing the laser ablation process. However, because the copper alignment layer is directly formed on the core layer of the inner circuit structure, the circuit layout of the core layer is restricted and the layout flexibility of the core layer is reduced.

SUMMARY

The invention provides a circuit board structure which may have a better layout flexibility.

The invention provides a manufacturing method of a circuit board structure, which is adapted to manufacture the above-mentioned circuit board structure.

The circuit board structure of the invention includes an inner circuit structure and a first build-up circuit structure. The inner circuit structure includes a core layer having an upper surface and a lower surface opposite to each other, a first patterned circuit layer disposed on the upper surface, a second patterned circuit layer disposed on the lower surface, and a conductive via connecting the first patterned circuit layer and the second patterned circuit layer. The first build-up circuit structure is disposed on the upper surface of the core layer and covers the first patterned circuit layer. The first build-up circuit structure at least has a cavity. The cavity exposes a portion of the first patterned circuit layer, and a cross-sectional profile of an edge of a top surface of the portion of the first patterned circuit layer exposed by the cavity is a curved surface.

In one embodiment of the invention, the first build-up circuit structure includes an inner dielectric layer, at least one first dielectric layer, at least one first patterned conductive layer and at least one first conductive via structure that penetrates through the inner dielectric layer and the first dielectric layer. The first patterned conductive layer and the first dielectric layer are sequentially stacked on the inner dielectric layer, and the first patterned conductive layer is electrically connected to the first patterned circuit layer via the first conductive via structure.

In one embodiment of the invention, the cavity further exposes a portion of the inner dielectric layer. The inner dielectric layer includes a first inner surface and a second inner surface. The first inner surface is higher than the second inner surface. The cavity exposes the second inner surface, and the top surface of the portion of the first patterned circuit layer exposed by the cavity is higher than the second inner surface.

In one embodiment of the invention, the cavity further exposes a portion of the inner dielectric layer. The inner dielectric layer includes a first inner surface and a second inner surface. The first inner surface is higher than the second inner surface. The cavity exposes the second inner surface, and the top surface of the portion of the first patterned circuit layer exposed by the cavity is aligned with the second inner surface.

In one embodiment of the invention, the cavity further exposes a portion of the core layer of the inner circuit structure. The upper surface of the core layer includes a first upper surface and a second upper surface. The cavity exposes the first upper surface, and the second upper surface is higher than the first upper surface. The top surface of the portion of the first patterned circuit layer exposed by the cavity is higher than the first upper surface.

In one embodiment of the invention, the cavity further exposes a portion of the upper surface of the portion of the core layer of the inner circuit structure. A bottom surface of the portion of the first patterned circuit layer exposed by the cavity is aligned with the portion of the upper surface of the core layer.

In one embodiment of the invention, the portion of the first patterned circuit layer exposed by the cavity includes at least one pad, at least one circuit or a combination thereof.

In one embodiment of the invention, the circuit board structure further includes a first patterned solder mask layer that is at least disposed on a first surface of the first build-up circuit structure relatively far away from the inner circuit structure and the portion of the first patterned circuit layer exposed by the cavity.

A manufacturing method of a circuit board structure of the invention includes the following steps: providing an inner circuit structure, wherein the inner circuit structure includes a core layer having an upper surface and a lower surface opposite to each other, a first patterned circuit layer disposed on the upper surface, a second patterned circuit layer disposed on the lower surface and a conductive via connecting the first patterned circuit layer and the second patterned circuit layer; performing a build-up process to laminate a first build-up circuit structure on the first patterned circuit layer, wherein the first build-up circuit layer at least includes an inner dielectric layer, and the inner dielectric layer directly covers the upper surface of the core layer and the first patterned circuit layer; removing a portion of the first build-up circuit layer to form an opening extending from a first surface of the first build-up circuit layer relatively far away from the inner circuit structure to a portion of the inner dielectric layer, wherein the opening exposes a first inner surface of the inner dielectric layer; performing a sandblasting process on the first inner surface of the inner dielectric layer exposed by the opening to at least remove the portion of the inner dielectric layer exposed by the opening so as to form a cavity at least exposing a portion of the first patterned circuit layer.

In one embodiment of the invention, the first build-up circuit structure further includes at least one first dielectric layer, at least one first patterned conductive layer and at least one first conductive via structure penetrating through the inner dielectric layer and the first dielectric layer. The first patterned conductive layer and the first dielectric layer are sequentially stacked on the inner dielectric layer, and the first patterned conductive layer is electrically connected to the first patterned circuit layer via the first conductive via structure.

In one embodiment of the invention, the cavity further exposes a second inner surface of the inner dielectric layer. The first inner surface is higher than the second inner surface, and a top surface of the portion of the first patterned circuit layer exposed by the cavity is higher than the second inner surface.

In one embodiment of the invention, a cross-sectional profile of an edge of the top surface of the portion of the first patterned circuit layer exposed by the cavity is a curved surface.

In one embodiment of the invention, the step of removing the portion of the first build-up circuit layer includes performing a depth control routing process or a sandblasting process on the first build-up circuit layer.

In one embodiment of the invention, the sandblasting process is performed on the first inner surface of the inner dielectric layer exposed by the opening to completely remove the inner dielectric layer and the portion of the core layer exposed by the opening so as to form the cavity exposing the portion of the first patterned circuit layer and a first upper surface of the core layer. The upper surface of the core layer includes the first upper surface and a second upper surface. The second upper surface is higher than the first upper surface, and a top surface of the portion of the first patterned circuit layer exposed by the cavity is higher than the first upper surface.

In one embodiment of the invention, a cross-sectional profile of an edge of the top surface of the portion of the first patterned circuit layer exposed by the cavity is a curved surface.

In one embodiment of the invention, the cavity further exposes a second inner surface of the inner dielectric layer. The first inner surface is higher than the second inner surface, and a top surface of the portion of the first patterned circuit layer exposed by the cavity is aligned with the second inner surface.

In one embodiment of the invention, the sandblasting process is performed on the first inner surface of the inner dielectric layer exposed by the opening to completely remove the inner dielectric layer exposed by the opening so as to form the cavity exposing the portion of the first patterned circuit layer and the upper surface of the portion of the core layer. A top surface of the portion of the first patterned circuit layer exposed by the cavity is higher than the exposed upper surface of the core layer.

In one embodiment of the invention, the sandblasting process is performed on the first inner surface of the inner dielectric layer exposed by the opening to completely remove the inner dielectric layer exposed by the opening so as to form the cavity exposing the portion of the first patterned circuit layer and the portion of the upper surface of the core layer. A bottom surface of the portion of the first patterned circuit layer exposed by the cavity is aligned with the upper surface.

In one embodiment of the invention, the portion of the first patterned circuit layer exposed by the cavity includes at least one pad, at least one circuit or a combination thereof.

In one embodiment of the invention, the manufacturing method of the circuit board structure further includes the step of forming a first patterned solder mask layer on at least a first surface of the first build-up circuit structure relatively far away from the inner circuit structure and the portion of the first patterned circuit layer exposed by the cavity after forming the cavity at least exposing the portion of the first patterned circuit layer.

Based on the above, in the process of manufacturing the circuit board structure of the invention, the sandblasting process is adopted to at least remove the portion of the inner dielectric layer exposed by the opening so as to form the cavity which at least exposes the portion of the first patterned circuit layer. Accordingly, there is no need to dispose the copper alignment layer for the formation of the cavity, and the circuit layout of the inner circuit structure is not affected. In light of the above, the circuit board structure formed in the invention may provide a larger layout space.

To make the above features and advantages of the invention more comprehensible, embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

FIG. 1A to FIG. 1E are cross-sectional schematic views illustrating a manufacturing method of a circuit board structure according to an embodiment of the invention.

DETAILED DESCRIPTION OF DISCLOSED EMBODIMENTS

Figure 2:
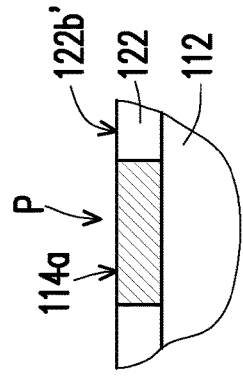
FIG. 2 is an enlargement view illustrating a pad region of the circuit board structure in FIG. 1D.
Figure 3:
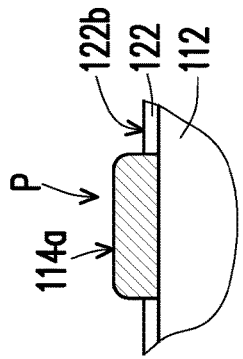
FIG. 3 is a partial top view of the circuit board structure in FIG. 1E.

FIG. 1A to FIG. 1E are cross-sectional schematic views illustrating a manufacturing method of a circuit board structure according to an embodiment of the invention. FIG. 2 is an enlargement view illustrating a pad region of the circuit board structure in FIG. 1D. FIG. 3 is a partial top view of the circuit board structure in FIG. 1E. Regarding the manufacturing method of the circuit board structure in the embodiment, first of all, referring to FIG. 1A, an inner circuit structure 110 is provided, wherein the inner circuit structure 110 includes a core layer 112 having an upper surface 111 and a lower surface 113 opposite to each other, a first patterned circuit layer 114 disposed on the upper surface 111, a second patterned circuit layer 116 disposed on the lower surface 113 and a conductive vial 118 connecting the first patterned circuit layer 114 and the second patterned circuit layer 116. Herein, a material of the first patterned circuit layer 114 and the second patterned circuit layer 116 is, for example, copper, nickel, palladium, beryllium or a copper alloy thereof, which should not be construed as a limitation to the invention.

Subsequently, referring to FIG. 1B, a build-up process is carried out to laminate a first build-up circuit structure 120 on the first patterned circuit layer 114, wherein the first build-up circuit structure 120 includes at least one inner dielectric layer 122, and the inner dielectric layer 122 directly covers the upper surface 111 of the core layer 112 and the first patterned circuit layer 114. Furthermore, the first build-up circuit structure 120 in the embodiment further includes at least one patterned conductive layer 124, at least one first dielectric layer 126 and at least one first conductive via structure 128 penetrating through the inner dielectric layer 122 and the first dielectric layer 126. The first patterned conductive layer 124 and the first dielectric layer 126 are sequentially stacked on the inner dielectric layer 122, and the first patterned conductive layer 124 is electrically connected to the first patterned circuit layer 114 via the first conductive via structure 128.

Further referring to FIG. 1B, the build-up process is carried out to laminate the first build-up circuit structure 120 on the first patterned circuit layer 114; furthermore, a second build-up circuit structure 130 is laminated on the second patterned circuit layer 116 simultaneously. The second build-up circuit structure 130 includes at least one second dielectric layer 132, at least one second patterned conductive layer 134 and at least one second conductive via structure 136 penetrating through the second dielectric layer 132. The second dielectric layer 132 and the second patterned conductive layer 134 are sequentially stacked on the lower surface 113 of the core layer 112, and the second patterned conductive layer 134 is electrically connected to the second patterned circuit layer 116 via the second conductive via structure 136.

Figure 1C:
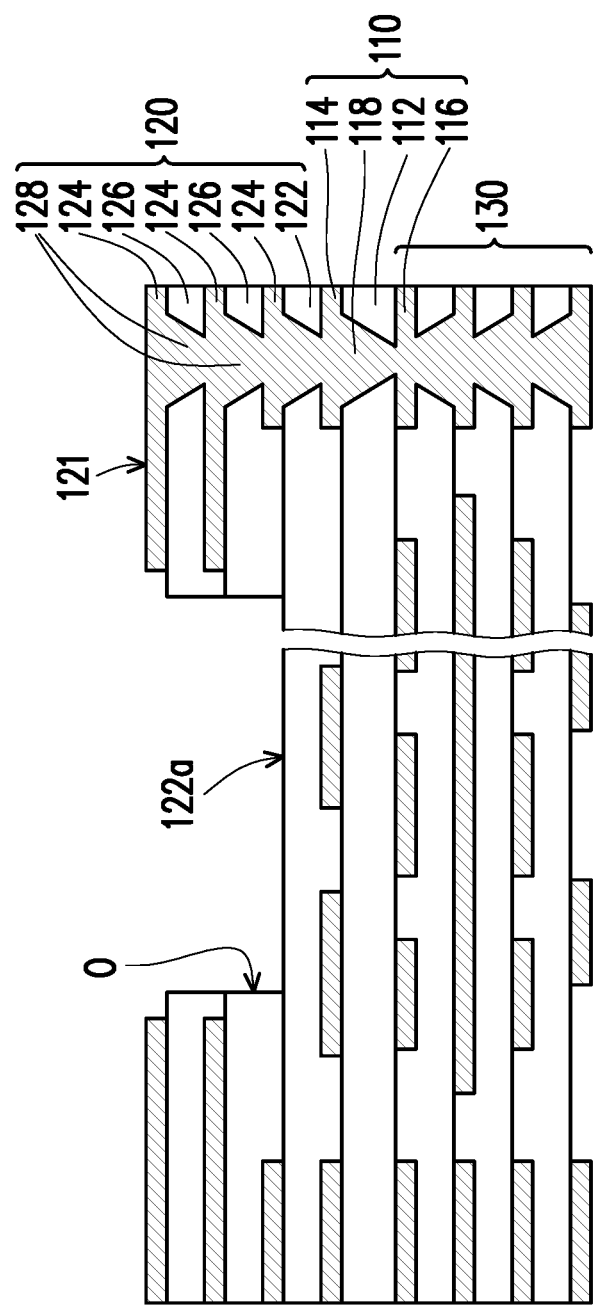

Next, referring to FIG. 1C, a portion of the first build-up circuit structure 120 is removed to form an opening O extending from a first surface 121 of the first build-up circuit structure 120 relatively far away from the inner circuit structure 110 to a portion of the inner dielectric layer 122, wherein the opening O exposes a first inner surface 122a of the inner dielectric layer 122. Herein, the step of removing the portion of the first build-up circuit structure 120 may be conducted by performing a depth control routing process or a sandblasting process on the first build-up circuit structure 120, which should not be construed as a limitation to the invention.

Figure 1D:
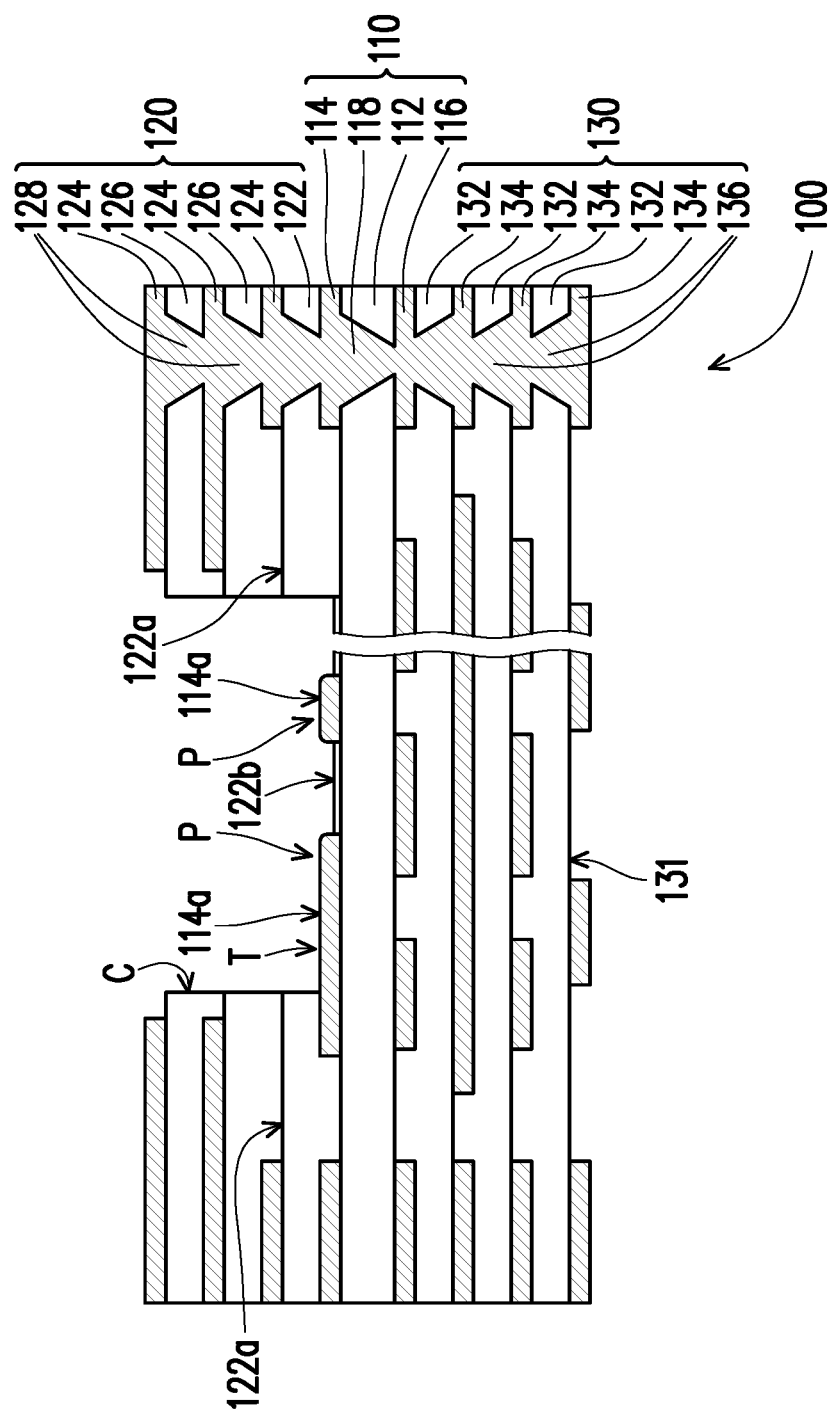

Thereafter, referring to FIG. 1C and FIG. 1D, a sandblasting process is carried out on the first inner surface 122a of the inner dielectric layer 122 exposed by the opening O to at least remove the portion of the inner dielectric layer 122 exposed by the opening O so as to form a cavity C which at least exposes a portion of the first patterned circuit layer 114. Specifically, the removing efficiency of the sandblasting process on the inner dielectric layer 122 is different from the removing efficiency of the sandblasting process on the first patterned circuit layer 114, wherein the efficiency of the sandblasting process for removing the inner dielectric layer 122 is greater than the efficiency of the sandblasting process for removing the first patterned circuit layer 114. As shown in FIG. 1D and FIG. 2, the cavity C in the embodiment specifically exposes a portion of the first patterned circuit layer 114 and a second inner surface 122b of the inner dielectric layer 122. The portion of the first patterned circuit layer 114 exposed by the cavity C is, for example, at least one pad, at least one circuit or a combination thereof. In the embodiment, the portion of the first patterned circuit layer 114 exposed by the cavity C is specifically a circuit T1 and a pad P, which should not be construed as a limitation to the invention. In the meantime, the first inner surface 122a of the inner dielectric layer 122 is specifically higher than the second inner surface 122b, and a top surface 114a of the portion of the first patterned circuit layer 114 exposed by the cavity C is higher than the second inner surface 122b. In particular, a cross-sectional profile of an edge of the top surface 114a of the circuit T and pad P of the first patterned circuit layer 114 exposed by the cavity C is specifically a curved surface.

Figure 1E:
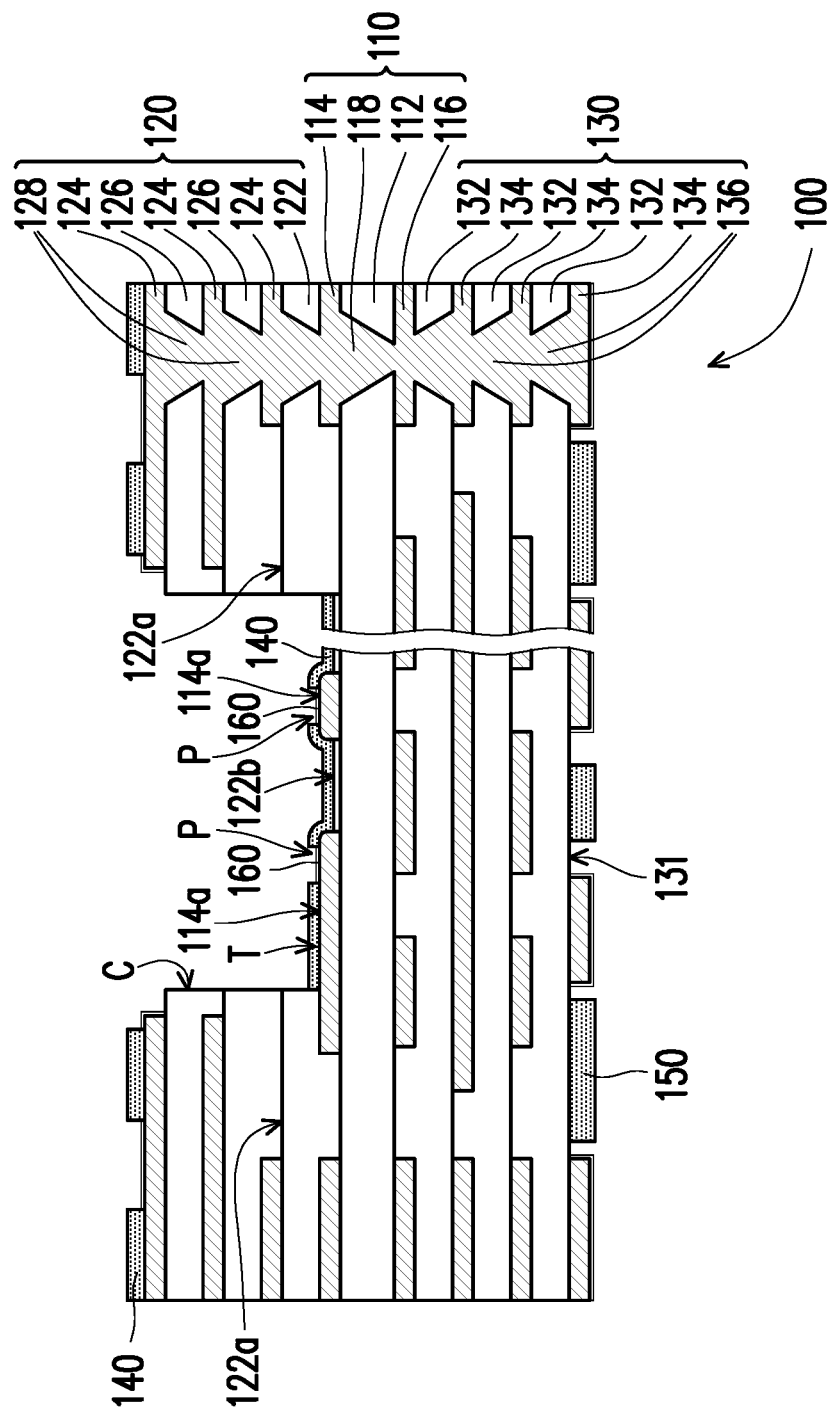

Finally, referring to FIG. 1E and FIG. 3, a first patterned solder mask layer 140 is formed on at least the first surface 121 of the first build-up circuit structure 120 relatively far away from the inner circuit structure 110 and the portion (i.e. circuit T and pad P) of the first patterned circuit layer 114 exposed by the cavity C; a second patterned solder mask layer 150 is formed on a second surface 131 of the second build-up circuit structure 130 relatively far away from the inner circuit structure 110. Herein, the first patterned solder mask layer 140 exposes a portion of the first dielectric layer 126 that is farthest from the inner circuit structure 110 and a portion of the pad P of the first patterned circuit layer 114. The second patterned solder mask layer 150 exposes a portion of the second dielectric layer 132 that is farthest from the inner circuit structure 110 and the second patterned conductive layer 134. The portion of the first patterned solder mask layer 140 on the portion (i.e. circuit T and pad P) of the first patterned circuit layer 114 exposed by the cavity C may be formed via the ink-jet printing method. In the embodiment, an oxidation protection layer 160, e.g. a gold plated layer or an OSP (Organic Solderability Preservative) layer, may further be formed on the pad P that is not covered by the first patterned solder mask layer 140. At this time, the circuit board structure 100 is completely manufactured.

In terms of structure, further referring to FIG. 1E, the circuit board structure 100 includes the inner circuit structure 110 and the first build-up circuit structure 120. The inner circuit structure 110 includes the core layer 112 having the upper surface 111 and lower surface 113 opposite to each other, the first patterned circuit layer 114 disposed on the upper surface 111, the second patterned circuit layer 116 disposed on the lower surface 113 and the conductive via 118 connecting the first patterned circuit layer 114 and the second patterned circuit layer 116. The first build-up circuit structure 120 is disposed on the upper surface 111 of the core layer 112 and covers the first patterned circuit layer 114. The first build-up circuit structure 120 at least includes the cavity C. The cavity C exposes a portion of the first patterned circuit layer 114, and the cross-sectional profile of the edge of top surface 114a of the portion of the first patterned circuit layer 114 exposed by the cavity C is a curved surface.

More specifically, the first build-up structure 120 in the embodiment includes the inner dielectric layer 122, the first patterned conductive layer 124, the first dielectric layer 126 and the first conductive via structure 128 penetrating through the inner dielectric layer 122 and the first dielectric layer 126. The first patterned conductive layer 124 and the first dielectric layer 126 are sequentially stacked on the inner dielectric layer 122, and the first patterned conductive layer 124 is electrically connected to the first patterned circuit layer 114 via the first conductive via structure 128. As shown in FIG. 1E, the cavity C in the embodiment exposes the portion of the inner dielectric layer 122. The inner dielectric layer 122 has the first inner surface 122a and the second inner surface 122b, wherein the first inner surface 122a is higher than the second inner surface 122b, the cavity C exposes the second inner surface 122b, and the top surface 114a of the portion (i.e. circuit T and pad P) of the first patterned circuit layer 114 exposed by the cavity C is higher than the second inner surface 122b.

Furthermore, the circuit board structure 100 in the embodiment further includes the second build-up circuit structure 130 disposed on the lower surface 113 of the core layer 112 and covering the second patterned circuit layer 116. The second build-up circuit structure 130 includes the second dielectric layer 132, the second patterned conductive layer 134 and the second conductive via structure 136 penetrating through the second dielectric layer 132. The second dielectric layer 132 and the second patterned conductive layer 134 are sequentially stacked on the lower surface 113 of the core layer 112, and the second patterned conductive layer 134 is electrically connected to the second patterned circuit layer 116 via the second conductive via structure 136.

In addition, the circuit board structure 100 in the embodiment further includes the first patterned solder mask layer 140 and the second patterned solder mask layer 150. The first patterned solder mask layer 140 is at least disposed on the first surface 121 of the first build-up circuit structure 120 relatively far away from the inner circuit structure 110 and the portion (i.e. circuit T and pad P) of the first patterned circuit layer 114 exposed by the cavity C. The second patterned solder mask layer 150 is disposed on the second surface 131 of the second build-up circuit structure 130 relatively far away from the inner circuit structure 110.

Since the embodiment adopts the sandblasting process which has different removing efficiency for removing the inner dielectric layer 122 and the first patterned circuit layer 114 to form the cavity C that at least exposes the portion (i.e. circuit T and pad P) of the first patterned circuit layer 114, there is no need to dispose the copper alignment layer for forming the cavity C in the embodiment, and the circuit layout of the inner circuit structure 110 is not affected. As a result, the circuit board structure 100 formed in the embodiment may provide a larger layout space.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 4A:
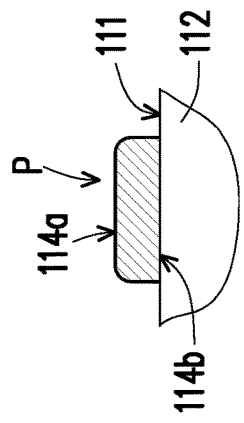
FIG. 4A to FIG. 4C are enlargement views respectively illustrating the pad region of the circuit board structure in FIG. 1D under different sandblasting depths.
Figure 4B:
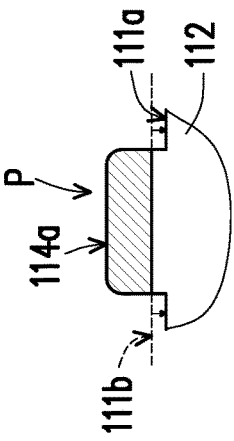
Figure 4C:
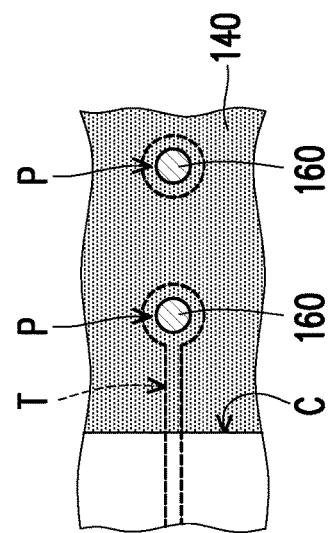
Figure 5A:
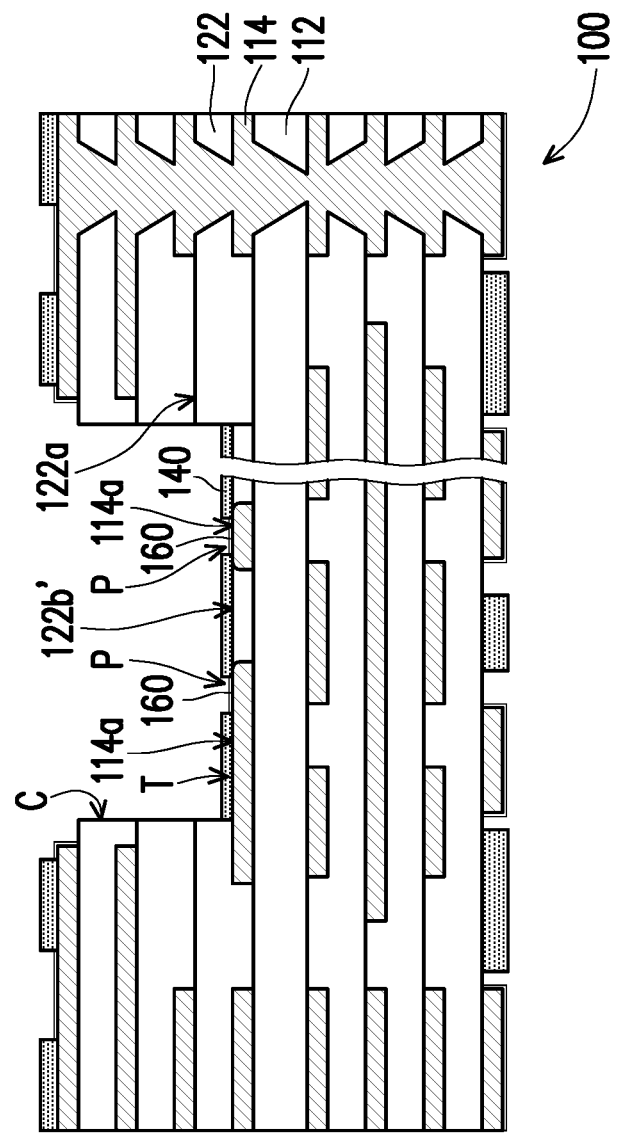
FIG. 5A to FIG. 5C are cross-sectional views respectively illustrating the pad region of the circuit board structure in FIG. 1E under different sandblasting depths.
Figure 5B:
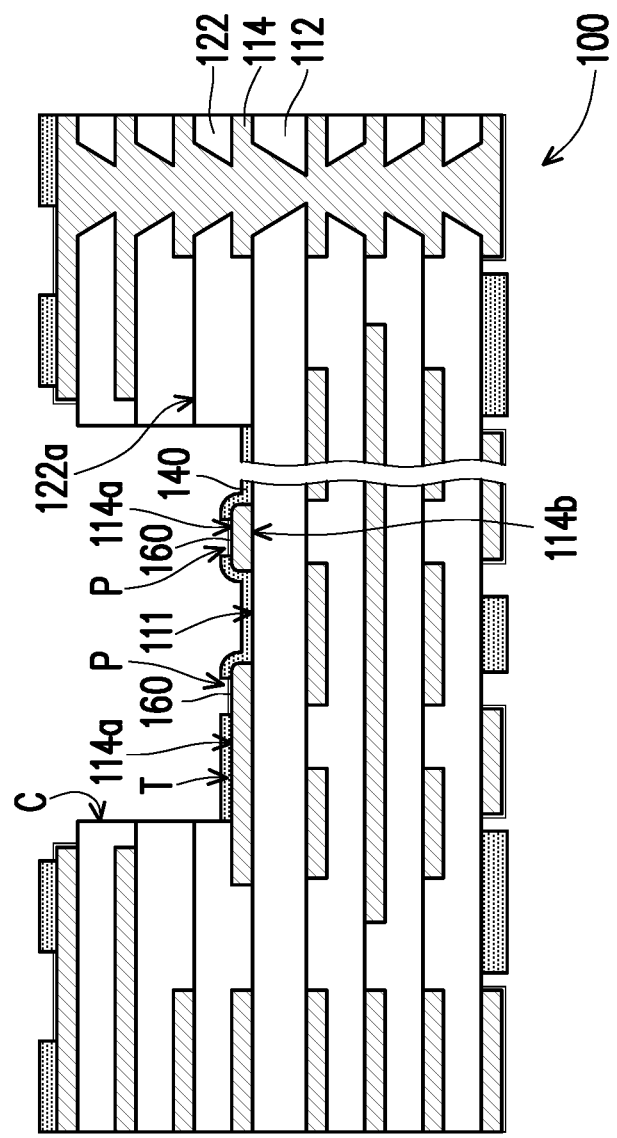
Figure 5C:
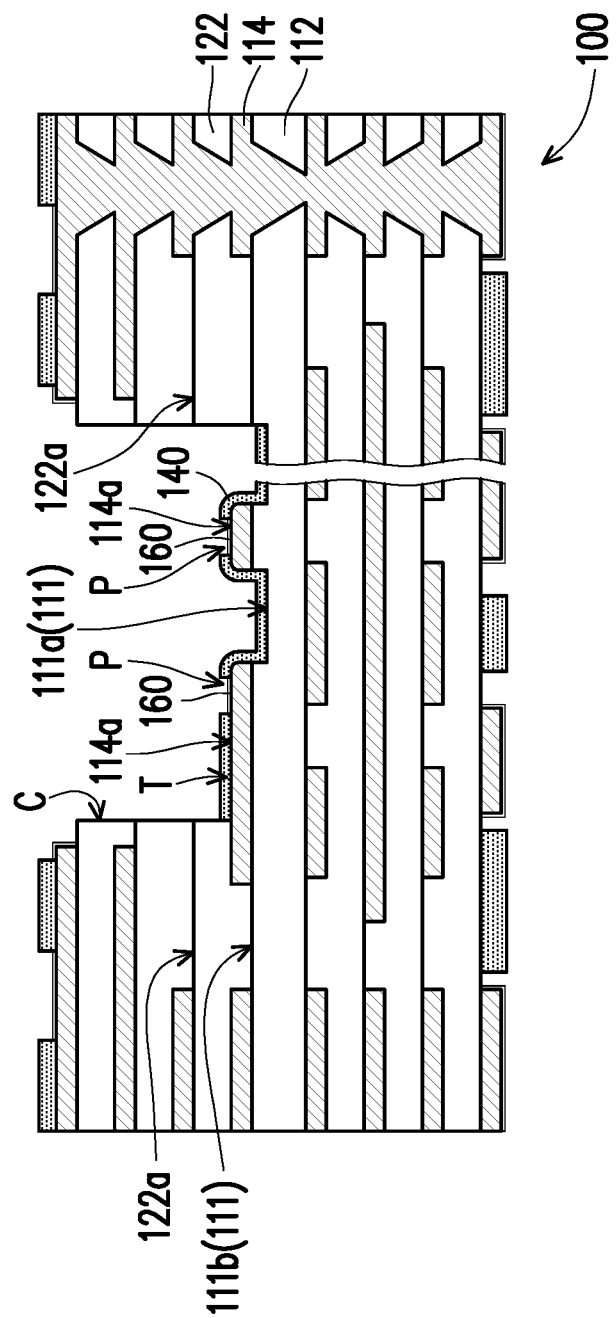

FIG. 4A to FIG. 4C are enlargement views respectively illustrating the pad region of the circuit board structure in FIG. 1D under different sandblasting depths. FIG. 5A to FIG. 5C are cross-sectional views respectively illustrating the pad region of the circuit board structure in FIG. 1E under different sandblasting depths. The passage below describes the structural differences generated under different sandblasting depths by referring to the above-mentioned drawings.

Referring to FIG. 4A and FIG. 5A, as compared with the embodiments in FIG. 2 and FIG. 1E, when the sandblasting process is carried on the first inner surface 122a of the inner dielectric layer 122 exposed by the opening C (see FIG. 1C), the sandblasting depth is smaller such that the portion of the inner dielectric layer 122 in the cavity C is removed, and the thickness of the inner dielectric layer 122 is equal to the thickness (or height) of the pad P. As a result, the cavity C exposes the portion (i.e. pad P and circuit T) of the first patterned circuit layer 114 and the second inner surface 122b' of the inner dielectric layer 122. Here, the first inner surface 122a is higher than the second inner surface 122b', and the top surface 114a of the portion of the first patterned circuit layer 114 exposed by the cavity C is aligned with the second inner surface 122b'.

Referring to FIG. 4B and FIG. 5B, as compared with the embodiments in FIG. 2 and FIG. 1E, when the sandblasting process is carried on the first inner surface 122a of the inner dielectric layer 122 exposed by the opening O (see FIG. 1C), the sandblasting depth is larger such that the inner dielectric layer 122 exposed by the opening O is completely removed. As a result, the cavity C exposes the portion (i.e. pad P and circuit T) of the first patterned circuit layer 114 and the portion of the upper surface 111 of the core layer 112. The top surface 114a of the portion of the first patterned circuit layer 114 exposed by the cavity C is higher than the upper surface 111 of the core layer 112. A cross-sectional profile of the edge of the top surface 114a of the portion (i.e. pad P and circuit T) of the first patterned circuit layer 114 exposed by the cavity C is specifically a curved surface, and a bottom surface 114b of the portion (i.e. pad P and circuit T) of the first patterned circuit layer 114 exposed by the cavity C is aligned with the upper surface 111.

Referring to FIG. 4C and FIG. 5C, as compared with the embodiments in FIG. 2 and FIG. 1E, when the sandblasting process is carried out on the first inner surface 122a of the inner dielectric layer 122 exposed by the opening O, the sandblasting depth is even larger such that the inner dielectric layer 122 exposed by the opening O and the portion of the core layer 112 are completely removed. As a result, the cavity C exposes the portion of the first patterned circuit layer 114 and a first upper surface 111a of the core layer 112. The upper surface 111 of the core layer 112 includes the first upper surface 111a and a second upper surface 111b, wherein the second upper surface 111b is higher than the first upper surface 111a, and the top surface 114a of the portion (i.e. pad P and circuit T) of the first patterned circuit layer 114 exposed by the cavity C is higher than the first upper surface 111a.

In summary, in the manufacturing process of the circuit board structure of the invention, since the sandblasting process is carried out to at least remove the portion of the inner dielectric layer exposed by the opening so as to form the cavity that at least exposes the portion of the first patterned circuit layer, there is no need to dispose the copper alignment layer for forming the cavity, and the circuit layout of the inner circuit structure is not affected. Therefore, the circuit board structure formed by the invention may provide a larger layout space.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A manufacturing method of a circuit board structure, comprising:
    providing an inner circuit structure, wherein the inner circuit structure comprises a core layer having an upper surface and a lower surface opposite to each other, a first patterned circuit layer disposed on the upper surface, a second patterned circuit layer disposed on the lower surface, and a conductive via connecting the first patterned circuit layer and the second patterned circuit layer;
    performing a build-up process to laminate a first build-up circuit structure on the first patterned circuit layer, wherein the first build-up circuit structure at least comprises an inner dielectric layer, and the inner dielectric layer directly covers the upper surface of the core layer and the first patterned circuit layer;

removing a portion of the first build-up circuit structure to form an opening extending from a first surface of the first build-up circuit structure relatively away from the inner circuit structure to a portion of the inner dielectric layer, wherein the opening exposes a first inner surface of the inner dielectric layer; and performing a sandblasting process on the first inner surface of the inner dielectric layer exposed by the opening to at least remove a portion of the inner dielectric layer exposed by the opening so as to form a cavity at least exposing a portion of the first patterned circuit layer, wherein the first build-up circuit structure further comprises at least a first dielectric layer, at least a first patterned conductive layer and at least a first conductive via structure penetrating through the inner dielectric layer and the first dielectric layer, the first patterned conductive layer and the first dielectric layer are sequentially stacked on the inner dielectric layer, and the first patterned conductive layer is electrically connected to the first patterned circuit layer via the first conductive via structure, wherein the cavity further exposes a second inner surface of the inner dielectric layer, the first inner surface is higher than the second inner surface, and a top surface of the portion of the first patterned circuit layer exposed by the cavity is higher than the second inner surface.

2. The manufacturing method of the circuit board structure as recited in claim 1, wherein a cross-sectional profile of an edge of the top surface of the portion of the first patterned circuit layer exposed by the cavity is a curved surface.

3. The manufacturing method of the circuit board structure as recited in claim 1, wherein removing the portion of the first build-up circuit structure comprises performing a depth control routing process or a sandblasting process on the first build-up circuit structure.

4. The manufacturing method of the circuit board structure as recited in claim 1, wherein the sandblasting process is performed on the first inner surface of the inner dielectric layer exposed by the opening to completely remove the inner dielectric layer exposed by the opening and a portion of the core layer so as to form the cavity exposing the portion of the first patterned circuit layer and a first upper surface of the core layer, the upper surface of the core layer comprises the first upper surface and a second upper surface, the second upper surface is higher than the first upper surface, and a top surface of the portion of the first patterned circuit layer exposed by the cavity is higher than the first upper surface.

5. The manufacturing method of the circuit board structure as recited in claim 4, wherein a cross-sectional profile of an edge of the top surface of the portion of the first patterned circuit layer exposed by the cavity is a curved surface.

6. The manufacturing method of the circuit board structure as recited in claim 1, wherein the portion of the first patterned circuit layer exposed by the cavity comprises at least a pad, at least a circuit or a combination thereof.

7. The manufacturing method of the circuit board structure as recited in claim 1, further comprising:

forming a first patterned solder mask layer on at least the first surface of the first build-up circuit structure relatively away from the inner circuit structure and the portion of the first patterned circuit layer exposed by the cavity after forming the cavity at least exposing the portion of the first patterned circuit layer.

8. A manufacturing method of a circuit board structure, comprising:

providing an inner circuit structure, wherein the inner circuit structure comprises a core layer having an upper surface and a lower surface opposite to each other, a first patterned circuit layer disposed on the upper surface, a second patterned circuit layer disposed on the lower surface, and a conductive via connecting the first patterned circuit layer and the second patterned circuit layer;

performing a build-up process to laminate a first build-up circuit structure on the first patterned circuit layer, wherein the first build-up circuit structure at least comprises an inner dielectric layer, and the inner dielectric layer directly covers the upper surface of the core layer and the first patterned circuit layer;

removing a portion of the first build-up circuit structure to form an opening extending from a first surface of the first build-up circuit structure relatively away from the inner circuit structure to a portion of the inner dielectric layer, wherein the opening exposes a first inner surface of the inner dielectric layer; and performing a sandblasting process on the first inner surface of the inner dielectric layer exposed by the opening to at least remove a portion of the inner dielectric layer exposed by the opening so as to form a cavity at least exposing a portion of the first patterned circuit layer, wherein the sandblasting process is performed on the first inner surface of the inner dielectric layer exposed by the opening to completely remove the inner dielectric layer exposed by the opening and a portion of the core layer so as to form the cavity exposing the portion of the first patterned circuit layer and a first upper surface of the core layer, the upper surface of the core layer comprises the first upper surface and a second upper surface, the second upper surface is higher than the first upper surface, and a top surface of the portion of the first patterned circuit layer exposed by the cavity is higher than the first upper surface.

* * * * *